(12) United States Patent
Blackshear et al.

(10) Patent No.: US 9,305,894 B2
(45) Date of Patent: Apr. 5, 2016

(54) CONSTRAINED DIE ADHESION CURE PROCESS

(71) Applicant: GLOBALFOUNDRIES Inc., Grand Cayman (KY)

(72) Inventors: Edmund Blackshear, Wappingers Falls, NY (US); Vijayeshwar D. Khanna, Millwood, NY (US); Oswald J. Mantilla, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 176 days.

(21) Appl. No.: 13/910,152

(22) Filed: Jun. 5, 2013

(65) Prior Publication Data
US 2014/0359995 A1   Dec. 11, 2014

(51) Int. Cl.
*H01L 23/00*   (2006.01)

(52) U.S. Cl.
CPC ....... *H01L 24/75* (2013.01); *H01L 2224/73204* (2013.01); *H01L 2224/75703* (2013.01); *Y10T 29/49826* (2015.01); *Y10T 29/49998* (2015.01)

(58) Field of Classification Search
CPC .................................................... H01L 21/687
See application file for complete search history.

(56) References Cited

U.S. PATENT DOCUMENTS

| | | | |
|---|---|---|---|
| 4,189,230 A | 2/1980 | Zasio | |
| 4,458,746 A | 7/1984 | Holden et al. | |
| 4,473,455 A | 9/1984 | Dean et al. | |
| 4,508,161 A | 4/1985 | Holden | |
| 5,203,958 A | 4/1993 | Arai et al. | |
| 5,316,786 A | 5/1994 | von der Lippe et al. | |
| 5,925,226 A | 7/1999 | Hurwitt et al. | |
| 6,000,924 A | 12/1999 | Wang et al. | |
| 6,113,088 A * | 9/2000 | Gakhar et al. | 269/139 |
| 6,123,864 A | 9/2000 | Tam et al. | |
| 6,224,936 B1 | 5/2001 | Gochnour et al. | |
| 6,270,621 B1 | 8/2001 | Tam et al. | |
| 6,527,999 B2 | 3/2003 | Gochnour et al. | |
| 6,592,670 B1 | 7/2003 | Gochnour et al. | |

(Continued)

FOREIGN PATENT DOCUMENTS

| | | |
|---|---|---|
| CN | 101587867 A | 11/2009 |
| WO | WO 9608838 A1 | 3/1996 |
| WO | WO 2006078068 A2 | 7/2006 |

OTHER PUBLICATIONS

Office Action from United States Patent and Trademark Office; U.S. Appl. No. 13/910,169; Apr. 24, 2015.

(Continued)

*Primary Examiner* — Lee D Wilson
(74) *Attorney, Agent, or Firm* — Heslin Rothenberg Farley & Mesiti P.C.; George Blasiak

(57) ABSTRACT

A clamping apparatus applies a force to a workpiece during processing. The clamping apparatus includes a base defining a work area configured to receive a joined structure having multiple elements. The base defines a recess in the work area. An adjustable mechanism is configured to releasably couple to the base and apply a adjustable downward force to the joined structure to bend the joined structure downwardly into the recess during a process. A resilient plunger is part of the adjustable mechanism. The resilient plunger extends downwardly from a top plate of the adjustable mechanism, and the resilient plunger is configured to contact a top of a first element of the joined structure to apply the downward force.

9 Claims, 3 Drawing Sheets

(56) References Cited

U.S. PATENT DOCUMENTS

| | | | |
|---|---|---|---|
| 6,764,549 B2 | 7/2004 | Gochnour et al. | |
| 6,811,738 B2 | 11/2004 | Magni et al. | |
| 6,830,719 B2 | 12/2004 | Gochnour et al. | |
| 6,860,731 B2 | 3/2005 | Ho et al. | |
| 6,969,641 B2 | 11/2005 | Matsunami | |
| 6,988,879 B2 | 1/2006 | Ho et al. | |
| 7,128,313 B1* | 10/2006 | Pliley | 269/95 |
| 7,172,927 B2 | 2/2007 | Yuan et al. | |
| 7,205,175 B2 | 4/2007 | Raben | |
| 7,364,147 B2* | 4/2008 | Shinozaki | 269/266 |
| 7,380,798 B2 | 6/2008 | Wolters | |
| 7,926,162 B2 | 4/2011 | Wolters | |
| 7,926,797 B2* | 4/2011 | Sorenson et al. | 269/45 |
| 7,964,444 B2 | 6/2011 | Sri-Jayantha | |
| 8,118,940 B2 | 2/2012 | Shimizu et al. | |
| 8,356,395 B2* | 1/2013 | Wu et al. | 29/256 |
| 9,219,051 B2 | 12/2015 | Allard et al. | |
| 2001/0012540 A1 | 8/2001 | Gochnour et al. | |
| 2005/0048699 A1 | 3/2005 | Matsunami | |
| 2005/0236780 A1 | 10/2005 | Wolters | |
| 2007/0117351 A1 | 5/2007 | Bradl et al. | |
| 2008/0104820 A1 | 5/2008 | Wolters | |
| 2009/0096143 A1* | 4/2009 | Wampler, II | 269/10 |
| 2009/0200251 A1 | 8/2009 | Shimizu et al. | |
| 2011/0024962 A1* | 2/2011 | Zhang | 269/107 |
| 2011/0232074 A1 | 9/2011 | Bradl et al. | |
| 2012/0229999 A1 | 9/2012 | Hussain | |
| 2014/0359995 A1* | 12/2014 | Blackshear et al. | 29/428 |

OTHER PUBLICATIONS

Issue Notification from United States Patent and Trademark Office; U.S. Appl. No. 13/910,169; Dec. 2, 2015.

Notice of Allowance United States Patent and Trademark Office; U.S. Appl. No. 13/910,169; Aug. 3, 2015.

Response to Office Action; U.S. Appl. No. 13/910,169; Filed with the United States Patent and Trademark Office on Jul. 9, 2015.

* cited by examiner

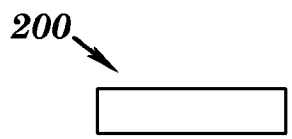
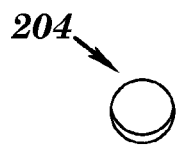
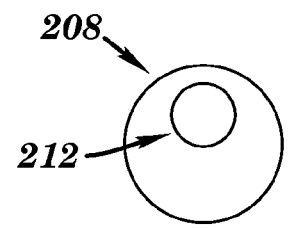
FIG. 5  FIG. 6  FIG. 7
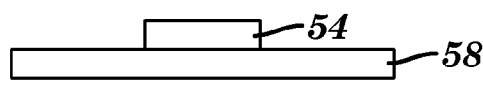
FIG. 8
*PRIOR ART*
FIG. 9
*PRIOR ART*
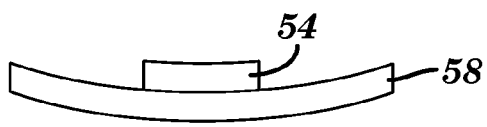
FIG. 10  FIG. 11

CONSTRAINED DIE ADHESION CURE PROCESS

CROSS REFERENCE TO RELATED APPLICATION

This application is related to the following commonly-owned, co-pending United States Patent Application filed on Jun. 5, 2013, the entire contents and disclosure of which is expressly incorporated by reference herein: U.S. patent application Ser. No. 13/910,169, for "LAMINATE PERIPHERAL CLAMPING TO CONTROL MICROELECTRONIC MODULE BSM WARPAGE".

BACKGROUND

1. Field

The present disclosure relates to a clamping apparatus and method for clamping a workpiece during processing.

2. Background of the Disclosure

An example process in the field of semiconductor manufacturing includes the process of dispensing underfill material between a chip die and a substrate such as a laminate in Flip Chip manufacturing. The laminate may include a thin core or coreless organic laminate. Underfill reduces the effects of mismatched coefficients of thermal expansion (CTE) between the die and laminate materials. Therefore, after curing of the underfill, the substrate or laminate is very susceptible to warping. For example, the laminate material can warp when cooling from a cure temperature. Warping is undesirable because it can lead to die cracking, thermal interface material (TIM) tearing, and ball grid array (BGA) coplanarity failure. All of which are unacceptable in meeting chip quality control standards.

Further, fabrication of organic flip chip electronic modules typically includes a chip join reflow on a laminate, such as a thin-laminate organic circuit board, for example, a printed wiring board (PWB) or printed circuit board (PCB). During fabrication of an organic flip chip electronic module, particularly those modules using thin core and coreless organic laminates, undesirable warpage of the laminate can be a problem. Undesirable die stresses can also result from variations in the laminate shape during reflow. Undesirable laminate warpage can also occur during processing of a chip/die and a laminate, for example, during flip chip fabrication which can present itself in a variety of shapes and each shape can affect the process in a different way. Die stresses can manifest themselves as a cracked die, or separations of the dielectric layers within the die (e.g., typically, white bumps). Increased laminate warpage (also referred to as warping) during die reflow can also lead to increased module warpage at the end of a bond and assembly process, which can cause the module to fail final co-planarity specifications.

Laminate warpage or warping may be defined by the laminate's curvature from a flat surface of the bottom of the laminate. Alternatively, laminate warpage may be defined by a planar surface mating with the bottom of the laminate, thereby providing a horizontal plane to reference any warping of the laminate.

BRIEF SUMMARY

It would be desirable to reduces the warping of substrates such as a laminate after curing of the a joined structure including the laminate. It would therefore also be desirable to provide an apparatus and method for constraining a laminate and a joined structure or joined die.

In an embodiment of the present invention, a clamping apparatus applies a force to a workpiece during processing. The clamping apparatus includes a base defining a work area configured to receive a joined structure having multiple elements. The base defines a recess in the work area. An adjustable mechanism is configured to releasably couple to the base and apply a adjustable downward force to the joined structure to bend the joined structure downwardly into the recess during a process. A resilient plunger is part of the adjustable mechanism. The resilient plunger extends downwardly from a top plate of the adjustable mechanism, and the resilient plunger is configured to contact a top of a first element of the joined structure to apply the downward force.

In another embodiment of the present invention, a method of manufacturing a clamping apparatus for applying a force to a workpiece during processing includes the steps of: defining a work area in a base, wherein the work area is configured to receive a joined structure having multiple elements; creating a recess in the work area of the base; attaching a resilient plunger extending downwardly from a top plate of an adjustable mechanism. The resilient plunger is configured to contact a top of a first element of the joined structure to apply an adjustable downward force, and the adjustable mechanism is releasably couplable to the base for applying the adjustable downward force to the joined structure to bend the joined structure downwardly into the recess during a process.

In another embodiment of the present invention, a method of applying a force to a workpiece during processing includes: positioning a joined structure having multiple elements in a work area of a base, wherein the base defines a recess in the work area; releasably coupling an adjustable mechanism to the base and to apply a adjustable downward force to the joined structure to bend the joined structure downwardly into the recess during a process; and applying the downward force to a top of a first element of the joined structure using a resilient plunger being part of the adjustable mechanism, the resilient plunger extending downwardly from a top plate of the adjustable mechanism to contact the top of the first element apply the downward force.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 5 is a isometric view of a rectangular end plate according to an embodiment of the disclosure;

FIG. 6 is a isometric view of a circular end plate according to an embodiment of the disclosure;

FIG. 7 is a isometric view of a dome shaped end plate according to an embodiment of the disclosure;

FIG. 8 is a side elevational view of a joined structure before a curing process, according to the prior art;

FIG. 9 is a side elevational view of a joined structure of FIG. 8 after the curing process, according to the prior art;

FIG. 10 is a side elevational view of a joined structure before a curing process, according to an embodiment of the disclosure; and FIG. 11 is a side elevational view of the joined structure of FIG. 10 after the curing process, according to an embodiment of the disclosure.

DETAILED DESCRIPTION

Figure 1:
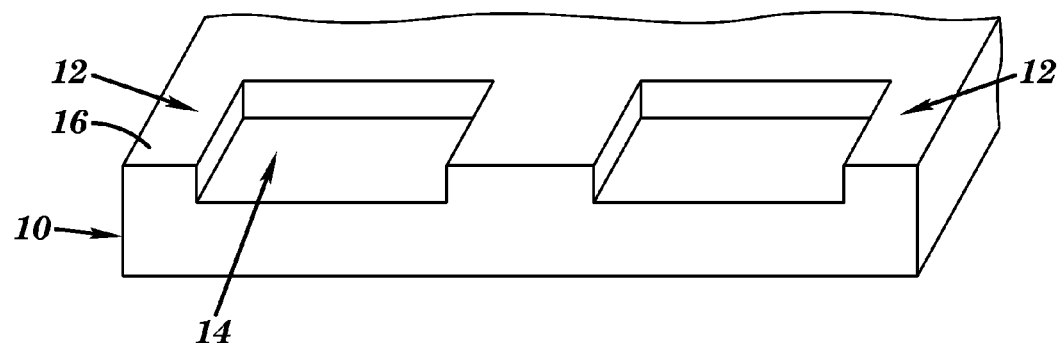
FIG. 1 is an isometric view of a base for a clamping apparatus, according to according to an embodiment of the disclosure.
Figure 2:
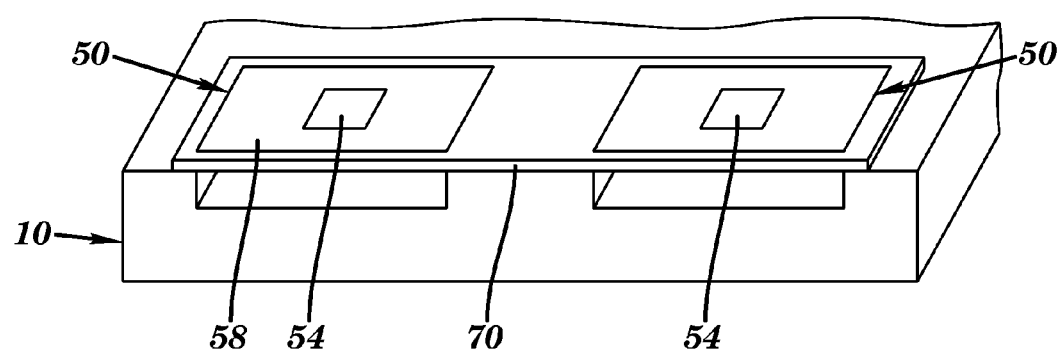
FIG. 2 is an isometric view of the base shown in FIG. 1 holding a joined structure.

Referring to FIGS. 1-4, a clamping apparatus 100 according to an embodiment of the invention for applying a force to a workpiece during processing is discussed below. The apparatus 100 (shown in FIG. 3) includes a base 10 defining multiple work areas 12 configured to each receive a joined structure having multiple elements. The elements of the apparatus may be applied to a single workpiece using a single work area, or may have multiple work areas or be a multi module apparatus or fixture, as in the embodiment shown herein. The present disclosure may refer to the apparatus elements singularly, however, it is understood that the elements may be duplicated in a multi work area apparatus as in the embodiment of the present disclosure. In the embodiment of the present disclosure, the joined structure is a joined die 50 (shown in FIG. 2) which includes a semiconductor chip 54 on a laminate 58. The laminate can be an embodiment of a substrate for a joined structure, and can be a coreless laminate. The base 10 includes a recess 14 in the work area 12. A frame 70 is received by the base 10 and work area 12. The frame 70 includes a receiving area for receiving the joined die 50. The receiving area of the frame 70 may include a central recessed portion such that the joined die 50 is received in a central recessed portion and flush with a perimeter of the frame 70.

Figure 3:
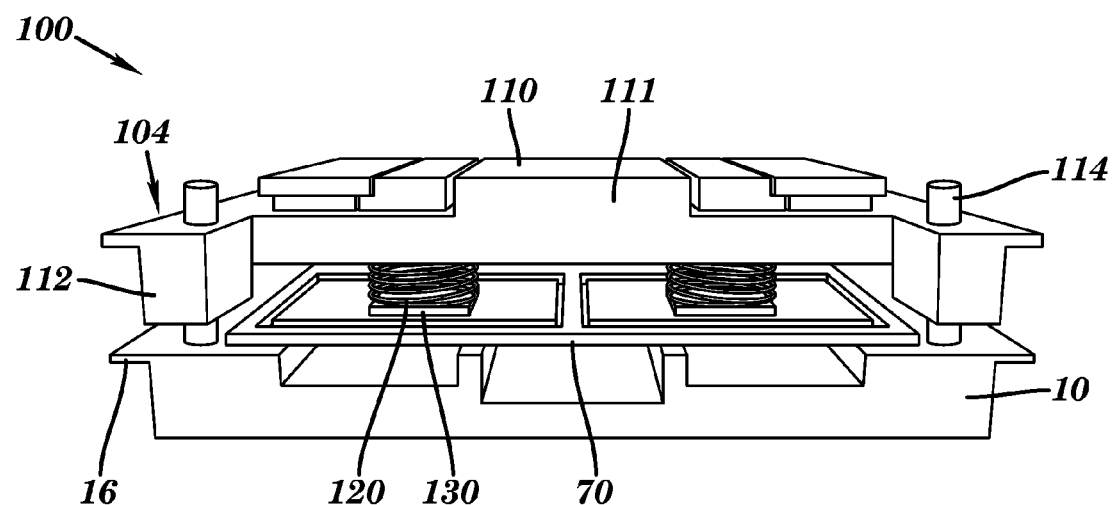
FIG. 3 is an isometric view of the clamping apparatus including the base shown in FIGS. 1 and 2, according to an embodiment of the disclosure, wherein an adjustable mechanism is attached to the base in an unlocked position.
Figure 4:
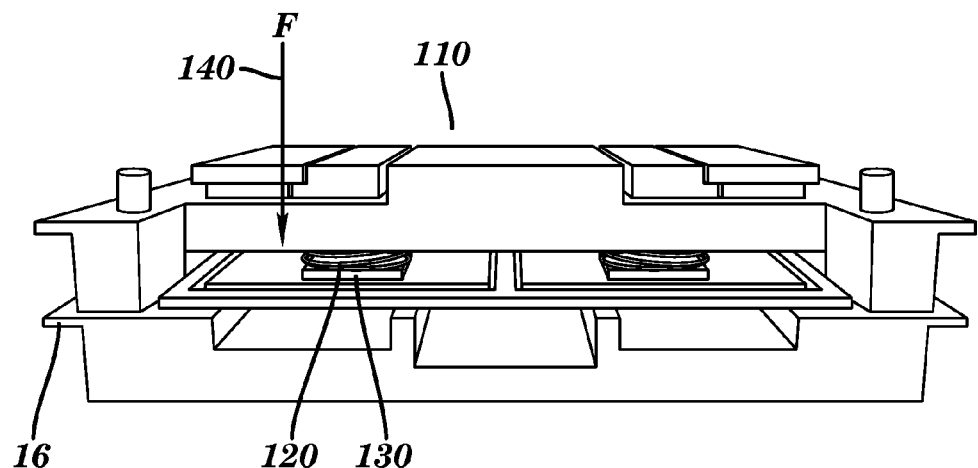
FIG. 4 is an isometric view of the clamping apparatus as shown in FIG. 3, wherein the adjustable mechanism is in a locked position.

Referring to FIGS. 3 and 4, an adjustable mechanism 104 includes a plate 110 having resilient plungers (also can be referred to as resilient members) embodied as springs 120 attached thereto. The adjustable mechanism 104 removably couples to the base 10 using opposing flanges 112 attached to opposing ends of the plate 110. The flanges 112 include attachment pins 114 for removably attaching the adjustable mechanism 104 to the base. The pins 114 are threaded into the base in aligning threaded holes.

The springs 120 are aligned over the chips 54. The distal ends of the springs 120 mate with an end plate 130. The combination of the spring 120 and the end plate 130 form a resilient plunger which can be used to apply a downward force to the die. The end plate 130 may have a predetermined shape, for example, a contour to provide an appropriate distribution of force across the die surface. For example, planar, convex, concave, or domed shaped. The controlled magnitude and direction of the force is applied to the top of the die using the end plate of the plunger. The amount of the force applied to the die is determined by how much biasing (bending) is desired of the joined structure to achieve the post curing affect desired. Further, the biasing or bending of the joined structure is designed to compensate for the post curing warping that occurs to achieve a flattening and a substantially planar structure after cooling from the curing process.

The adjustable mechanism 104 is shown being positioned in FIG. 3, before it is in its locked position which is shown in FIG. 4. The locked position is achieved when the pins 114 are completely threaded into the holes such that the flanges 112 rest on the ledges 16 of the base 10, as shown in FIG. 4, and the plate 110 thereby applies a downward force 140 to the springs 120. In the locked position of the apparatus 100 shown in FIG. 4, the springs 120 apply the downward force 140 to the top of the die 54 via the end plate 130. The force applied to the die is distributed across the joined structure (or package surface), that is, the laminate. The joined structure, i.e., the laminate 58 and die 54 are bent or flexed downwardly as shown in FIG. 10. For example, the laminate of the joined structure may be bent downwardly about 50 microns from a horizontal plane. The downwardly applied force 140 can also be described as bending the structure into a preflexed or prestressed or biased shape. The apparatus 100 with the joined structure can be processed, for example, in a processing chamber. The process can be an underfill (resin material) cure process, wherein a material is positioned between the die and the laminate. After underfill is dispensed it requires a bake operation to cure the resin or material. Underfilling with a material reduces the effects of a mismatch of coefficients of thermal expansion (CTE) between the die and laminate materials during curing. Cooling after the curing process can results in warping of a substrate, for example, the laminate 58.

The curing process can have a temperature of about 150 degrees Celsius. The biased laminate 58 shown in FIG. 10, is thus processed at temperatures of about 150 degrees Celsius. After cooling from the processing, the laminate bends or warps. However, as a result of the biasing of the joined structure using the clamping apparatus, the laminate is substantially flat as shown in FIG. 11. Thus, the pre biasing of the joined structure results in a substantially planar end product after processing, in this case, a joined laminate and die, by restricting the warp effects of underfill curing.

The adjustable mechanism 104 is adjustable over the base by adjusting the pins 114 in the threaded holes on the ledges of the base. When the pins 114 are fully threaded and the flanges 112 are in contact with the ledges 16 of the base 10, the adjustable mechanism is in the locked position, to apply the downward force to the joined structure. The adjustable mechanism is in an unlocked position when the side flanges 112 of the mechanism 104 are not coupled to the ledges 16 of the base 10.

The end plate may be a selected shape to facilitate the joining processes and to maintain a consistent pressure on the die when the die flexes with the laminate. For example, a planar end plate 200 or a circular end plate 204 as shown in FIGS. 5 and 6 may be used. A dome shaped end plate 208 as shown in FIG. 7 may also be used. The dome area 212 is positioned on the top of the chip 54. Thus, when the joined structure is pre stressed or biased, the dome fits into the contour of the die, which is now slightly convex.

One of the advantages of the present disclosure is the reduction or elimination of warping of the laminate of the joined structure as a result of curing the underfill between the die and the laminate, for example during a FCBGA (Flip Chip Ball Grid Array) semiconductor processing. The present disclosure utilizes a downward force, a load, which is controlled by the apparatus 100 to control the shape of the die and laminate, or a chip substrate subassembly, during an underfill cure process. The downward force as described in the present disclosure minimizes die camber and module warpage resulting from underfill cure shrinkage and differential expansion when cooling from a cure temperature.

In an alternative implementation, a load can be applied to the laminate (or a substrate) bottom using a vacuum.

Thereby, the present disclosure provides a clamping apparatus 100 for providing a force 140 to a workpiece, for example, a joined structure during processing according to an embodiment of the invention. The clamping apparatus includes the base 10 defining the work area 12 configured to receive the joined structure having multiple elements. The base defines a recess 14 in the work area of the base 10. The adjustable mechanism 110 is configured to releasably couple to the base and apply the adjustable downward force 140 to the joined structure to bend the joined structure downwardly into the recess during a process. The resilient contoured plunger 120 is part of the adjustable mechanism, and the resilient plunger extends downwardly from a top plate 111 of the adjustable mechanism 110. The resilient plunger is configured to contact a top of the first element, embodied as the die 54, of the joined structure to apply the downward force. The resilient plunger can be embodied as the spring 120 and can include the end plate attached to the distal end of the spring.

Further, the apparatus and method of the present disclosure constrains the joined structure along a vertical axis, while allowing for movement along a horizontal plane due to thermal expansion, while biasing the joined structure as desired and described above.

In operation, the present disclosure provides a method of using a clamping apparatus for applying a force to a workpiece during processing, according to an embodiment of the invention. The method of applying a force to a workpiece during processing can include positioning the joined structure 50 having multiple elements, i.e., the laminate 58 and the die 54, in the work area 12 of the base 10. The method includes releasably coupling the adjustable mechanism 110 to the base 12, to apply an adjustable downward force to the joined structure 50 to bend the joined structure downwardly into the recess 14 during a process. The downward force 140 is applied to the top of the first element, that is, the die 54, using the resilient plunger, for example the spring 120 and the end plate 130, wherein the resilient plunger extends downwardly from the top plate 111 of the adjustable mechanism 110 to contact the top of the die and apply the downward force 140.

The adjustable mechanism is in a locked position when the side flanges 112 attached to opposite ends of the top plate 111 are releasable coupled to the mating ledges 16 of the base 10 to apply the adjustable downward force to the joined structure. Thereby, ipso facto, unlocking, or the adjustable mechanism in an unlocked position, includes when the side flanges of the adjustable mechanism are not coupled to the ledges.

The resilient member, that is, the spring 120 can have a specified stiffness to exert the desired downward force.

While embodiments of the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A clamping apparatus for applying a force to a workpiece during processing, comprising:

a base defining a work area configured to receive a joined structure having multiple elements, the base defining a recess in the work area;

an adjustable mechanism being configured to releasably couple to the base and apply a adjustable downward force to the joined structure to bend the joined structure downwardly into the recess during a process; and a resilient plunger being part of the adjustable mechanism, the resilient plunger extending downwardly from a top plate of the adjustable mechanism, the resilient plunger being configured to contact a top of a first element of the joined structure to apply the downward force, and wherein the joined structure includes the first element joined to a second element, and wherein the first element is a die and the second element is a laminate positioned under the die.

2. The apparatus of claim 1, wherein the resilient plunger includes an end plate coupled to a distal end thereof.

3. The apparatus of claim 1, wherein the plunger includes a contoured end plate coupled to a distal end thereof, the end plate configured to contact the top of the first element of the joined structure.

4. The apparatus of claim 1, wherein the plunger includes a convex or a concave end plate coupled to a distal end thereof, the end plate configured to contact the top of the first element of the joined structure.

5. The apparatus of claim 1, wherein the plunger includes a dome shaped end plate coupled to a distal end thereof, the end plate configured to contact the top of the first element of the joined structure.

6. The apparatus of claim 1, wherein the adjustable mechanism and the resilient plunger are configured to selectively apply and release the downward force to the joined structure.

7. The apparatus of claim 1, wherein the resilient plunger includes a spring.

8. The apparatus of claim 1, further comprising a frame configured to receive the joined structure, and the frame being positionable in the work area.

9. A clamping apparatus for applying a force to a workpiece during processing, comprising:

a base defining a work area configured to receive a joined structure having multiple elements, the base defining a recess in the work area;

an adjustable mechanism being configured to releasably couple to the base and apply a adjustable downward force to the joined structure to bend the joined structure downwardly into the recess during a process; and a resilient plunger being part of the adjustable mechanism, the resilient plunger extending downwardly from a top plate of the adjustable mechanism, the resilient plunger being configured to contact a top of a first element of the joined structure to apply the downward force, and wherein the adjustable mechanism includes a locked position wherein side flanges attached to opposite ends of the top plate are releasable coupled to mating ledges of the base to apply the adjustable downward force to the joined structure, and the adjustable mechanism includes an unlocked position wherein the side flanges are not coupled to the ledges.

* * * * *